United States Patent
Jiang et al.

(10) Patent No.: US 7,247,937 B2
(45) Date of Patent: Jul. 24, 2007

(54) MOUNTING PAD STRUCTURE FOR WIRE-BONDING TYPE LEAD FRAME PACKAGES

(75) Inventors: Shin-Shing Jiang, Taipei Hsien (TW); Sheng-Yuan Lee, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 408 days.

(21) Appl. No.: 11/031,659

(22) Filed: Jan. 6, 2005

(65) Prior Publication Data

US 2006/0145341 A1    Jul. 6, 2006

(51) Int. Cl.
  H01L 23/52    (2006.01)
  H01L 23/495   (2006.01)
  H01L 23/34    (2006.01)
  H01L 23/498   (2006.01)

(52) U.S. Cl. ............... 257/691; 257/676; 257/E23.061; 257/E23.039; 257/E23.066; 257/728; 257/E23.067

(58) Field of Classification Search ................ 257/666, 257/668, 676, 691, 728, 784, E23.061, E23.066, 257/E23.067, E23.039; 438/123, 125
See application file for complete search history.

(56) References Cited

U.S. PATENT DOCUMENTS

| | | | |
|---|---|---|---|
| 6,191,494 B1 * | 2/2001 | Ooyama et al. | 257/796 |
| 6,455,355 B1 * | 9/2002 | Lin et al. | 438/119 |
| 6,713,849 B2 * | 3/2004 | Hasebe et al. | 257/667 |
| 7,049,696 B2 * | 5/2006 | Kubo | 257/706 |

\* cited by examiner

*Primary Examiner*—Luan Thai
(74) *Attorney, Agent, or Firm*—J.C. Patents

(57) ABSTRACT

A chip package having a lead frame, a chip, a plurality of bonding wires, and an insulation material is provided. The lead frame comprises a die pad, a plurality of leads, a plurality of signal pads and a plurality of non-signal pads. The signal pads and non-signal pads are underneath the signal leads and non-signal leads respectively. The non-signal pad is directly connected to a non-signal plane in the circuit board through its own vias. The signal pad has a structure which extends toward its adjacent non-signal pads. With the signal pad size enlarged, the capacitance between the non-signal plane in the circuit board and the signal pad is increased. The increased capacitance compensates the inductance induced from the bonding wires and improves the response of the signal propagation path for RF applications.

20 Claims, 14 Drawing Sheets

MOUNTING PAD STRUCTURE FOR WIRE-BONDING TYPE LEAD FRAME PACKAGES

BACKGROUND OF THE INVENTION

1. Field of the Invention

The present invention relates to a mounting pad structure of wire-bonding type lead-frame packages. More particularly, the present invention relates to a mounting pad structure which can improve the performance of wire-bonding type lead-frame packages.

2. Description of the Related Art

Modern electronic products typically enclose a semiconductor chip and a carrier for electrically connecting with the semiconductor chip. At present, there are three major techniques for connecting a chip to a carrier, namely, a wire-bonding process, a flip-chip process and a tape-automated-bonding (TAB) process. If the carrier is a lead frame, the wire-bonding process is often used to connect the chip with the leads on the lead frame. Bonding wires of a package induces parasitic inductance which becomes more significant when the operating frequency is beyond several gigahertz (GHz) for Radio Frequency (RF) products. The parasitic inductance has adverse effects on the circuit performance. Therefore, a method for reducing the parasitic inductance and improving the frequency response at high frequencies shall be introduced.

FIG. 1A is a schematic cross-sectional view of a conventional QFN (Quad Flat Non-Lead) package mounted on a circuit board for RF applications. FIGS. 1B and 1C are perspective view and top view respectively of the coplanar bonding wire structure of single-ended mode shown in FIG. 1A. As shown in FIGS. 1A, 1B and 1C, the chip package 100 comprises a chip 110, a lead frame 120, a plurality of bonding wires 130 and an insulation material 140. The lead frame 120 has a die pad 121 and a plurality of ground leads 122 and signal leads 123. The ground leads 122 and signal leads 123 are distributed evenly at the peripheral area of the die pad 121. The chip 110 is attached to the die pad 121 through adhesive glue. The bonding wires 130 connecting the chip 110 to the respective leads 122, 123 are formed in a wire-bonding process. The die pad 121 and the ground lead 122 are electrically grounded to a ground plane 170 through a ground pad 181, a die pad landing and ground vias 160. The insulation material 140 encapsulates the chip 110, the lead frame 120 and the bonding wires 130. The die pad 121, the ground leads 122, and signal leads 123 of the chip package 100 are attached to the circuit board 190 through the application of adhesive materials.

FIG. 1D is a top view of the mounting pad structure of single-ended mode shown in FIG. 1A. In the conventional pad design, the signal pad 182 is underneath the signal lead 123 and has a shape which corresponds to the signal pad 182. Similarly for the ground pad 181, it is underneath the ground lead 122 and has a shape which corresponds to the ground pad 181. The ground pad 181 is connected to the die pad landing which is underneath the die pad 121 and is electrically grounded to a ground plane 170 through ground vias 160.

FIG. 2A is a perspective view of a conventional coplanar bonding wire of differential mode. FIG. 2B is a top view of a conventional coplanar bonding wire of differential mode. The differential mode involves one transmission line 231 carries a positive signal and the other transmission line 231 carries a negative signal for signal pins. The signals are equal in amplitude and opposite in polarity. The two transmission lines 231 have a differential impedance of around 100 Ohms. The two signal leads 223 are adjacent to each other in a differential-mode wire-bonding type package. To the opposite side which is adjacent to the other signal lead 223, there is an adjacent ground lead 222. Underneath the signal lead 223, there is a signal pad 282 and similarly, there is a ground pad 281 underneath the ground lead 222. The size and shape of the ground pad 281 and the signal pad 282 correspond to the ground lead 222 and the signal lead 223 respectively. The ground pad 281 is connected to the die pad landing which is underneath the die pad and is electrically grounded to a ground plane 170 through ground vias 160.

SUMMARY OF THE INVENTION

Accordingly, the present invention is to provide mounting pad structures which can improve the performance of wire-bonding type packages.

In accordance with the purpose of the invention, as embodied and broadly described herein, the invention extends the signal pad towards its adjacent non-signal pads to overlap with part of the non-signal leads which enlarges the size of the signal pad. The signal pad can extend to the direction of one adjacent non-signal pad or the directions of both two adjacent non-signal pads. The non-signal pads are connected to the non-signal plane through their own vias which leave some spaces for the signal pad to extend. The enlargement of the signal pad increases the capacitance between the signal pad and the non-signal plane in the circuit board and helps to compensate the parasitic inductance induced from the bonding wires. As a result, the frequency response is substantially improved.

Both the foregoing general description and the following detailed description are exemplary and explanatory only and are not restrictive of the invention, as claimed. It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
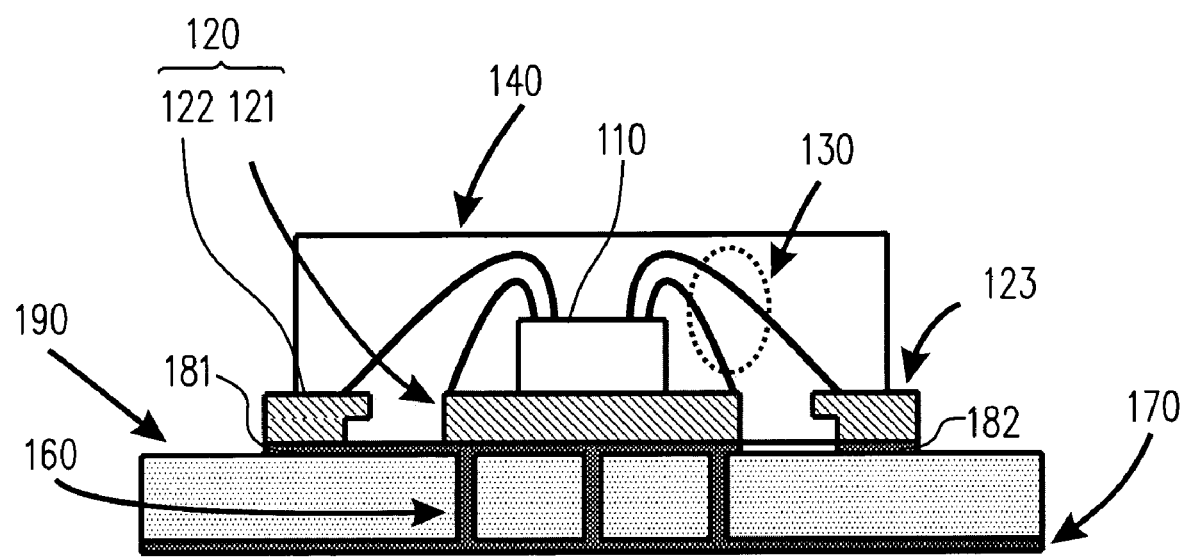
FIG. 1A is a schematic cross-sectional view of a conventional QFN (Quad Flat Non-Lead) package mounted on a circuit board for RF applications.
Figure 1B:
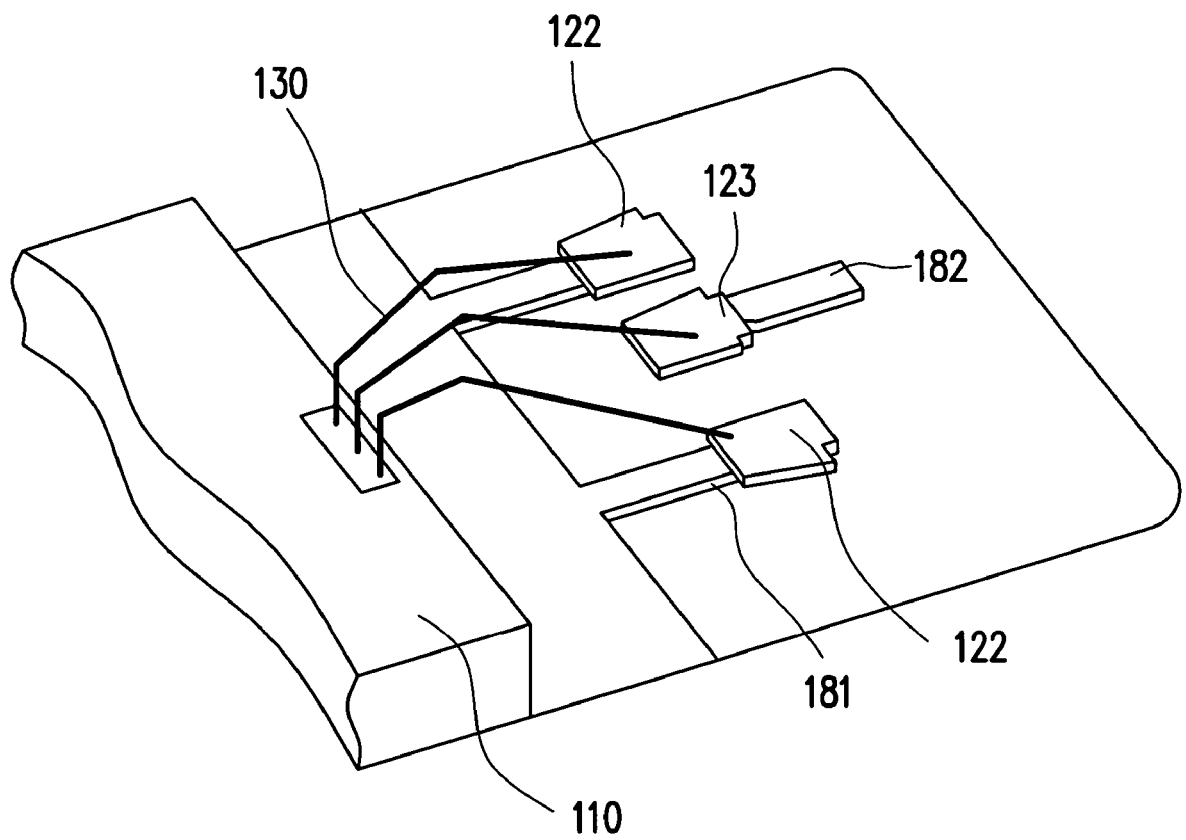
FIG. 1B is a perspective view of the coplanar bonding wire structure of single-ended mode shown in FIG. 1A.
Figure 1C:
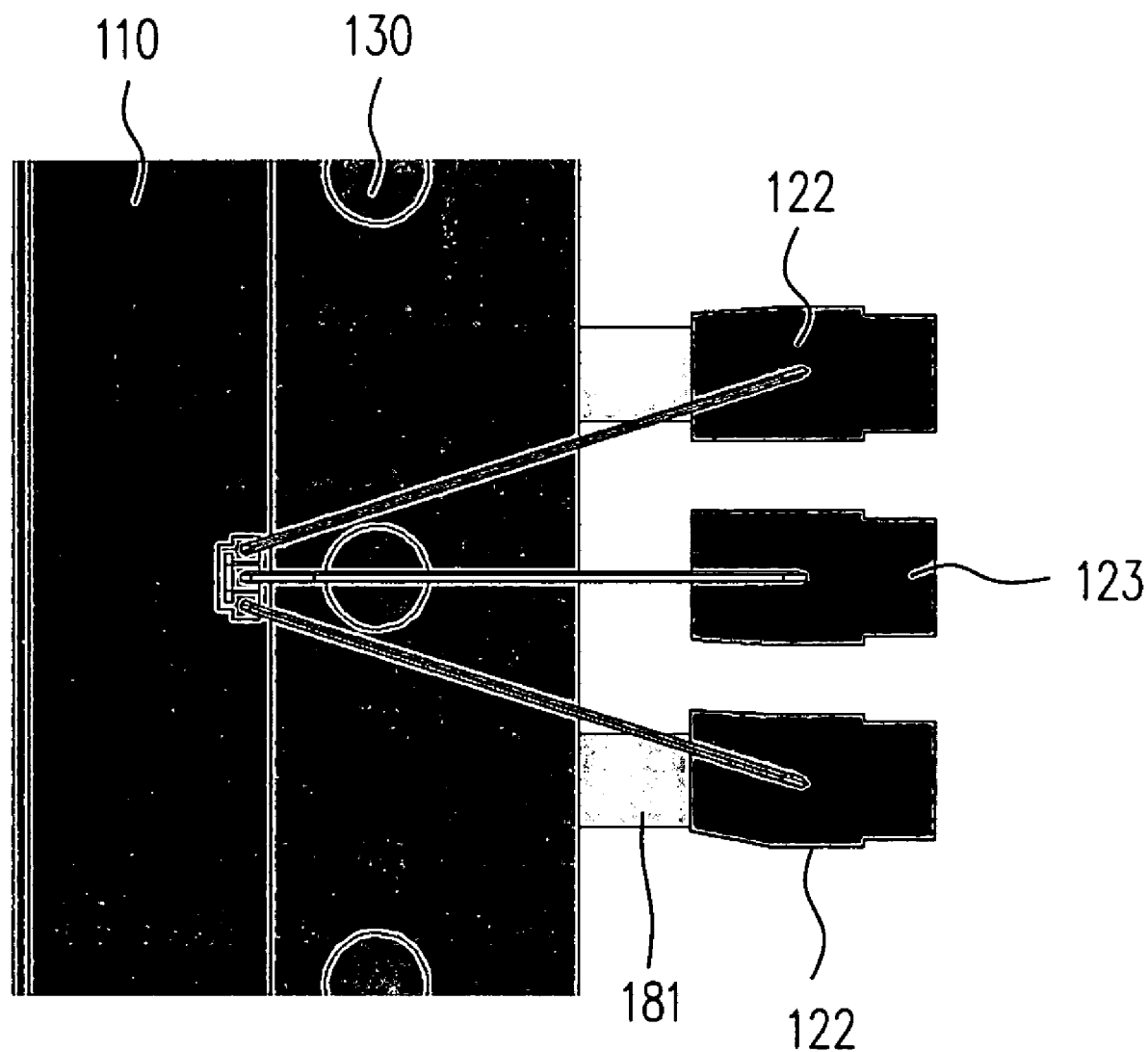
FIG. 1C is a top view of the coplanar bonding wire structure of single-ended mode shown in FIG. 1A.

Reference will now be made in detail to the present preferred embodiments of the invention, examples of which are illustrated in the accompanying drawings. Wherever possible, the same reference numbers are used in the drawings and the description to refer to the same or like parts.

First Embodiment

Figure 3A:
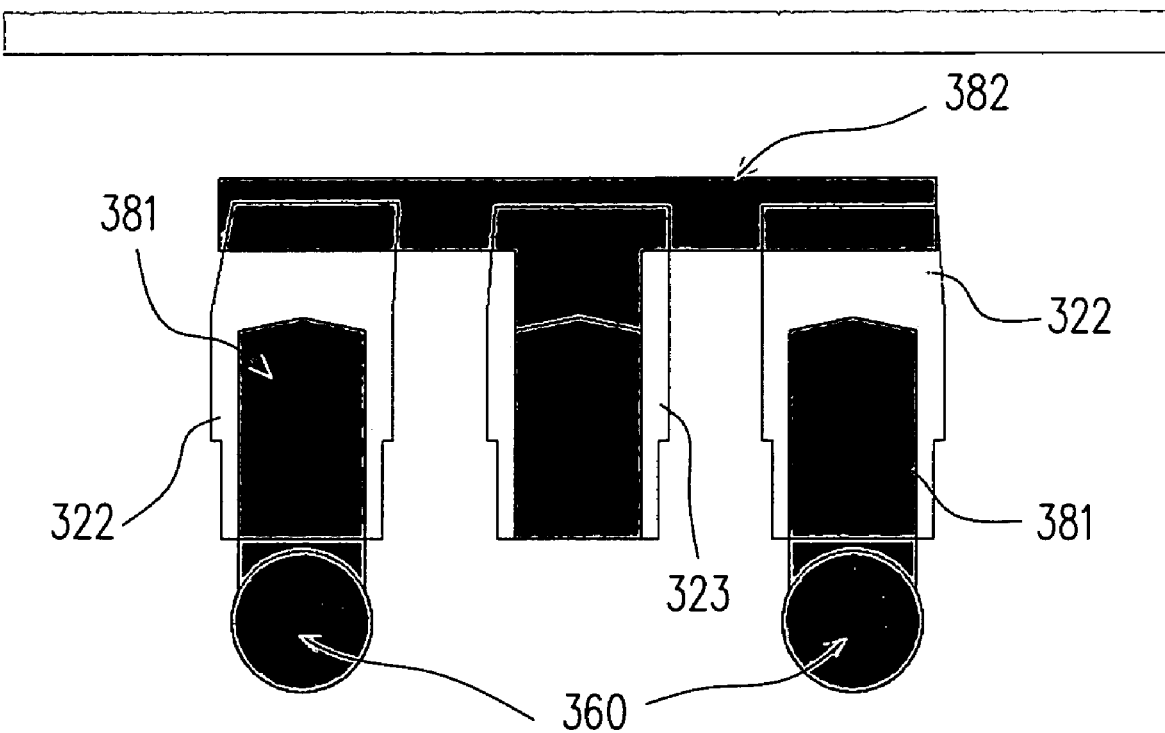
FIG. 3A is a top view of a protrudent T-shaped mounting pad according to a first preferred embodiment of this invention.
Figure 3B:
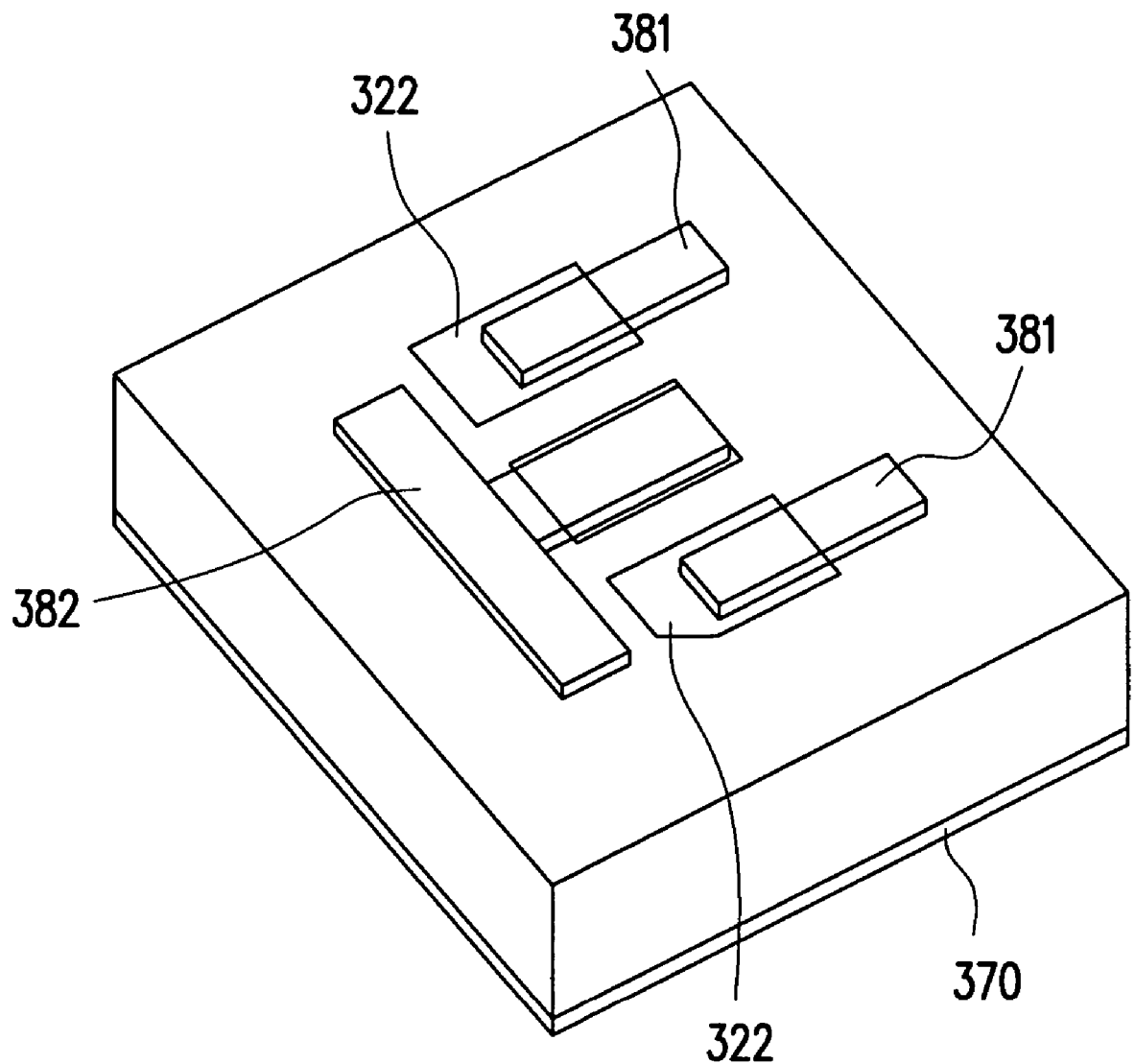
FIG. 3B is a perspective view of a protrudent T-shaped mounting pad according to a first preferred embodiment of this invention.

FIG. 3A is a top view of a protrudent T-shaped mounting pad according to a first preferred embodiment of this invention. FIG. 3B is a perspective view of a protrudent T-shaped mounting pad according to a first preferred embodiment of this invention. Referring to FIGS. 3A and 3B, instead of connecting ground pad 181 to the die pad landing underneath of the die pad 121 for connection to the ground plane 170 as seen in the prior art, the ground pads 381 are now connected to the ground plane 370 through their own vias 360. The ground pads 381 are extended in a direction which is away from the chip 110 (not shown in the figure) and then they are grounded through vias 360. With this new ground pad 381 design, some free spaces are available for the signal pad 382 to extend toward its adjacent ground pads 381. The signal pad 382 is extended towards its adjacent ground pads 381 to overlap with part of the adjacent ground leads 322, but without touching the adjacent ground pads 381 and the adjacent ground lead 322. In addition, the signal pad 382 can overlap with only a small part of the ground leads 322 or it can be extended to exceed the ground leads 322. In this embodiment, a protrudent T-shaped signal pad is formed with two adjacent ground leads 322 on each side of the signal lead 323. Since the protrudent T-shaped signal pad 382 has a larger size than the signal pad in the prior art, the capacitance between the signal pad 382 and the ground plane 370 in the circuit board can be increased. The increased capacitance can compensate the parasitic inductance induced from the bonding wires 130, which improves the impedance matching and enhances the performance of the package at high frequencies. One advantage of the present invention is that the size of the signal pad 382 can be freely adjusted to achieve an optimum circuit performance.

Figure 1D:
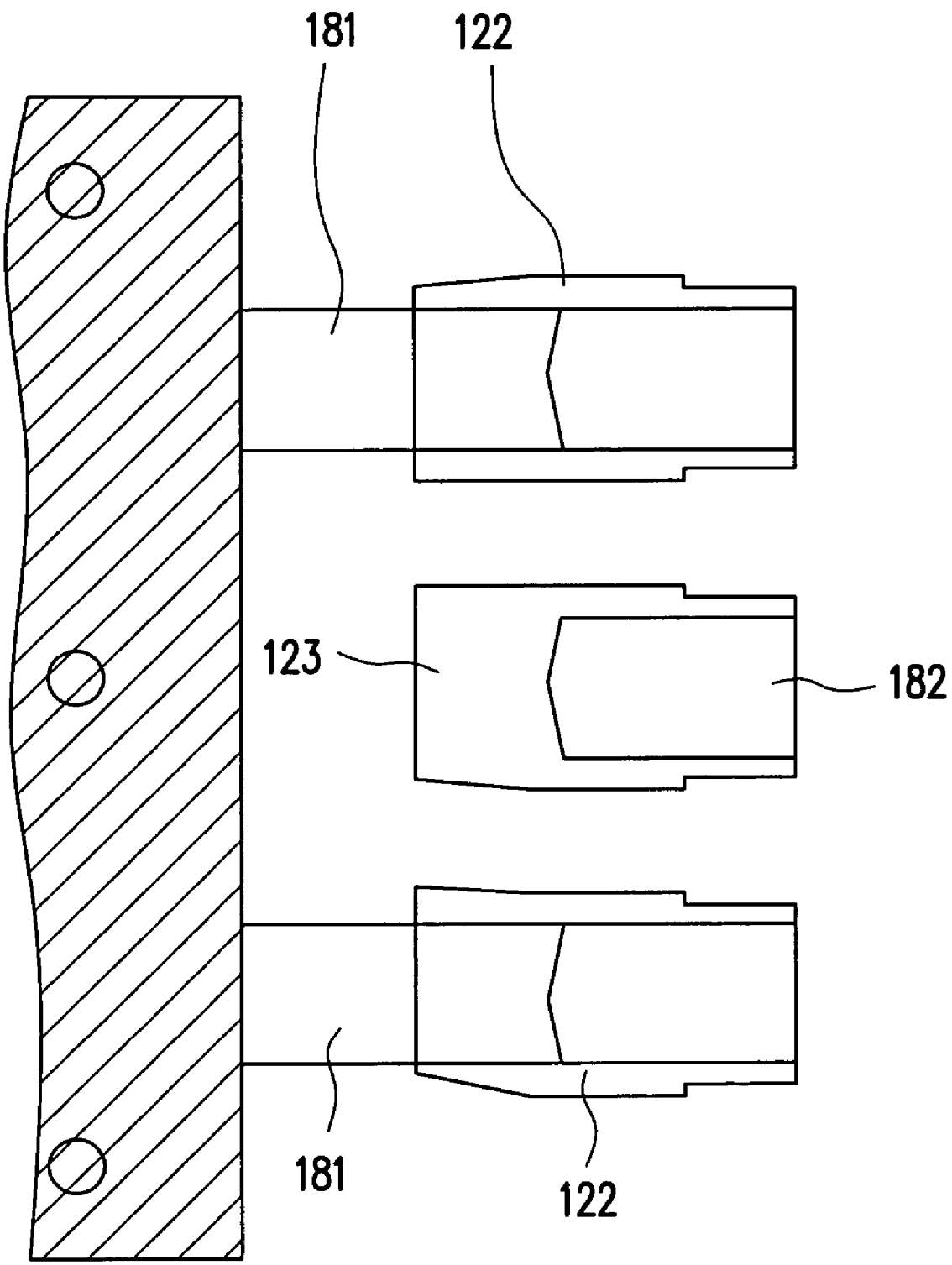
FIG. 1D is a top view of the mounting pad structure of single-ended mode shown in FIG. 1A.
Figure 4A:
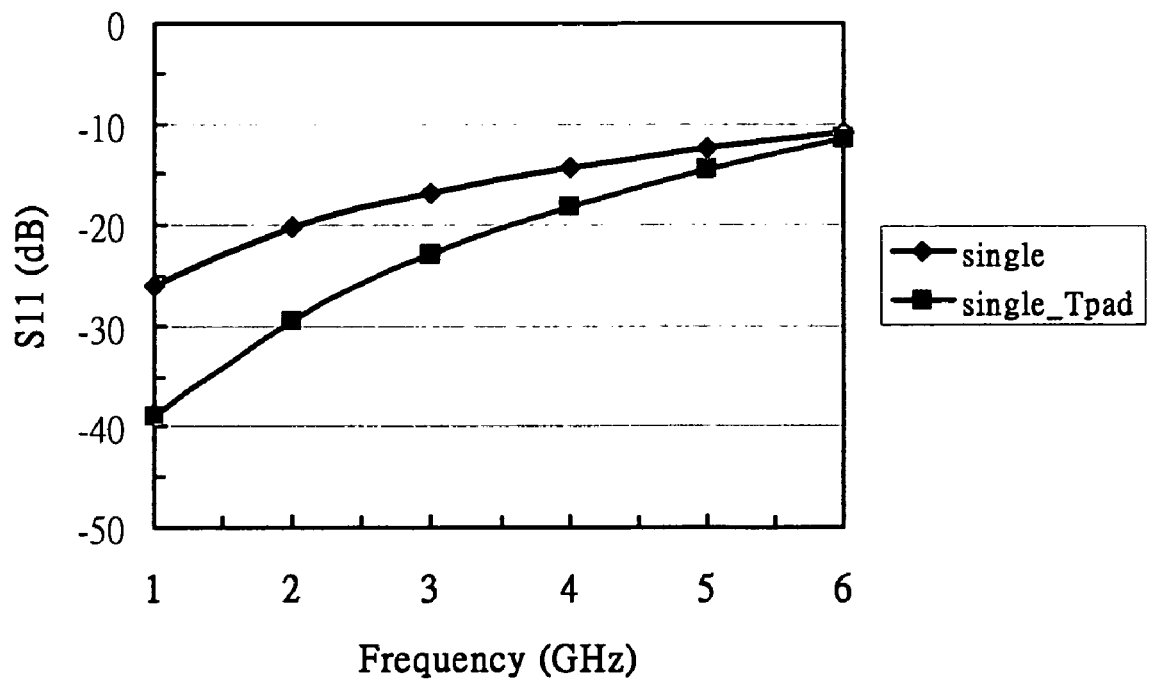
FIG. 4A is a graph showing the $S_{11}$ frequency response curves in various cases.

FIG. 4A provides a clear picture of comparing the performance of the first preferred embodiment with the conventional pad design as seen in FIG. 1D. FIG. 4A is a graph showing the $S_{11}$ frequency response curves in these 2 cases of singled-ended mode. The curve labeled "single" represents the frequency response of the conventional pad design of singled-ended mode, and the "single_Tpad" curve shows the frequency response of the invented T-shaped pad of singled-ended mode. This graph shows $S_{11}$, impedance matching versus frequency in the frequency range of 1 to 6 GHz. It can be observed that frequency response of the invented T-shaped pad structure is superior to the conventional pad design, especially in the lower frequency range.

Figure 4B:
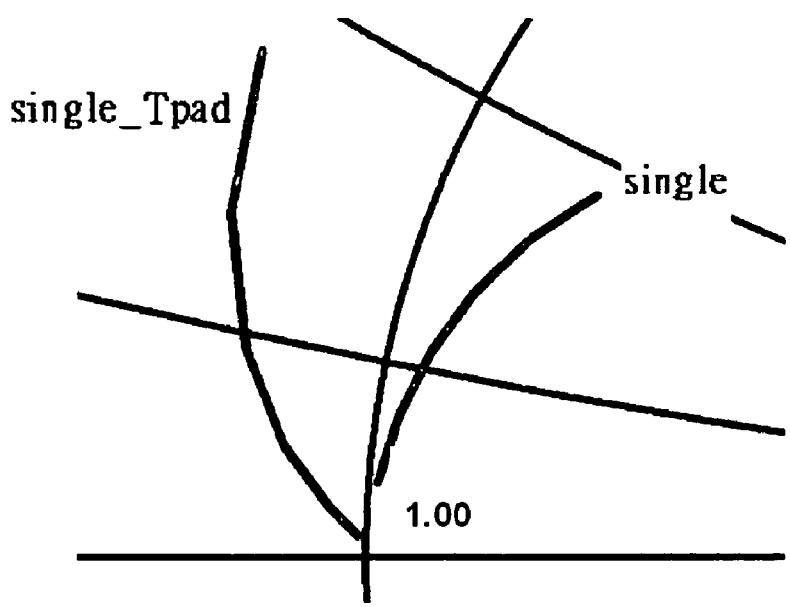
FIG. 4B is a Smith chart showing the frequency response curves in various cases.

FIG. 4B is a Smith chart showing the frequency response curves for the conventional pad and the invented T-shaped pad. Once again, "single" represents the conventional pad design and "single_Tpad" represents the invented T-shaped pad. Since the top half of the Smith chart exhibits inductive impedance and the bottom half exhibits capacitive impedance, the best impedance matching is achieved with a $S_{11}$ curve located in the middle of the chart (indicated as 1.00 in FIG. 4B). The invented T-shaped pad curve, "single_Tpad" is closer to the center (indicated as 1.00 in FIG. 4B) than the conventional pad design curve, "single" means that the inductance has been compensated in the invented T-pad. This explains why better impedance matching can be obtained with the invented T-shaped pad.

Second Embodiment

Figure 2A:
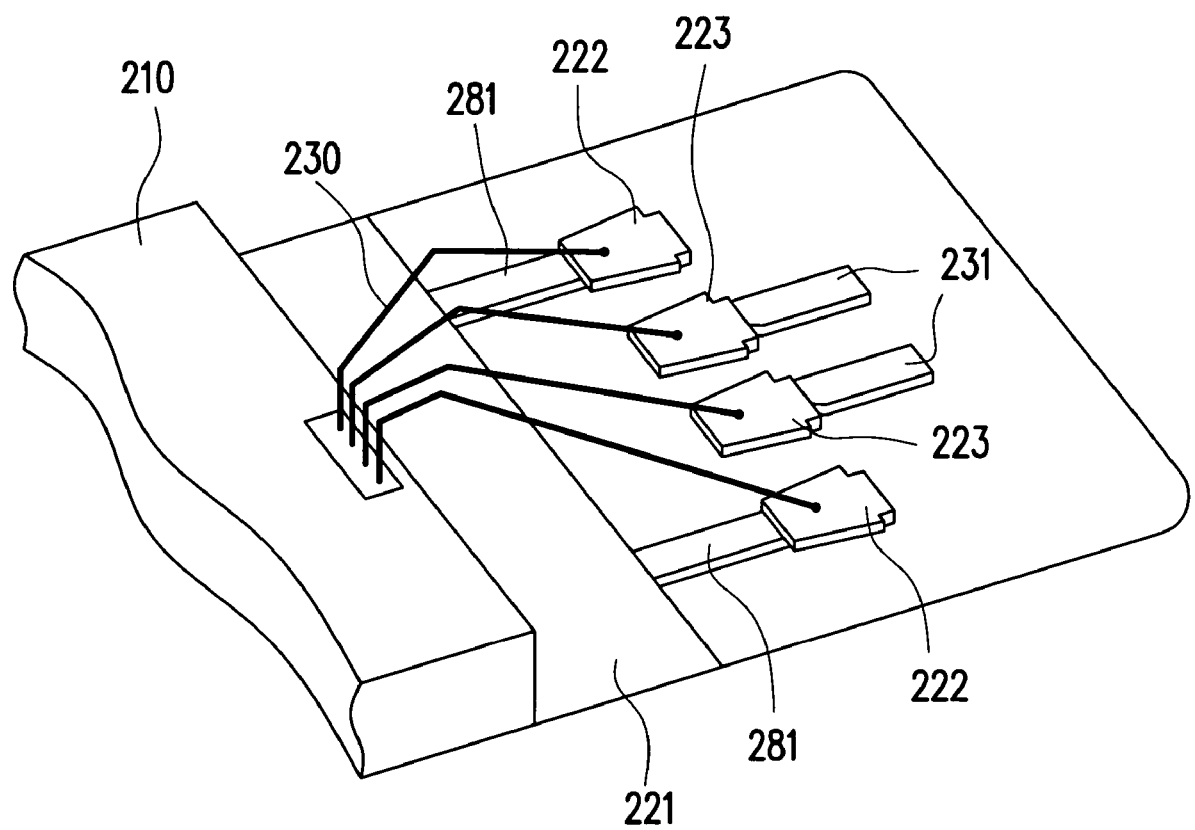
FIG. 2A is a perspective view of a conventional coplanar bonding wire of differential mode.
Figure 2B:
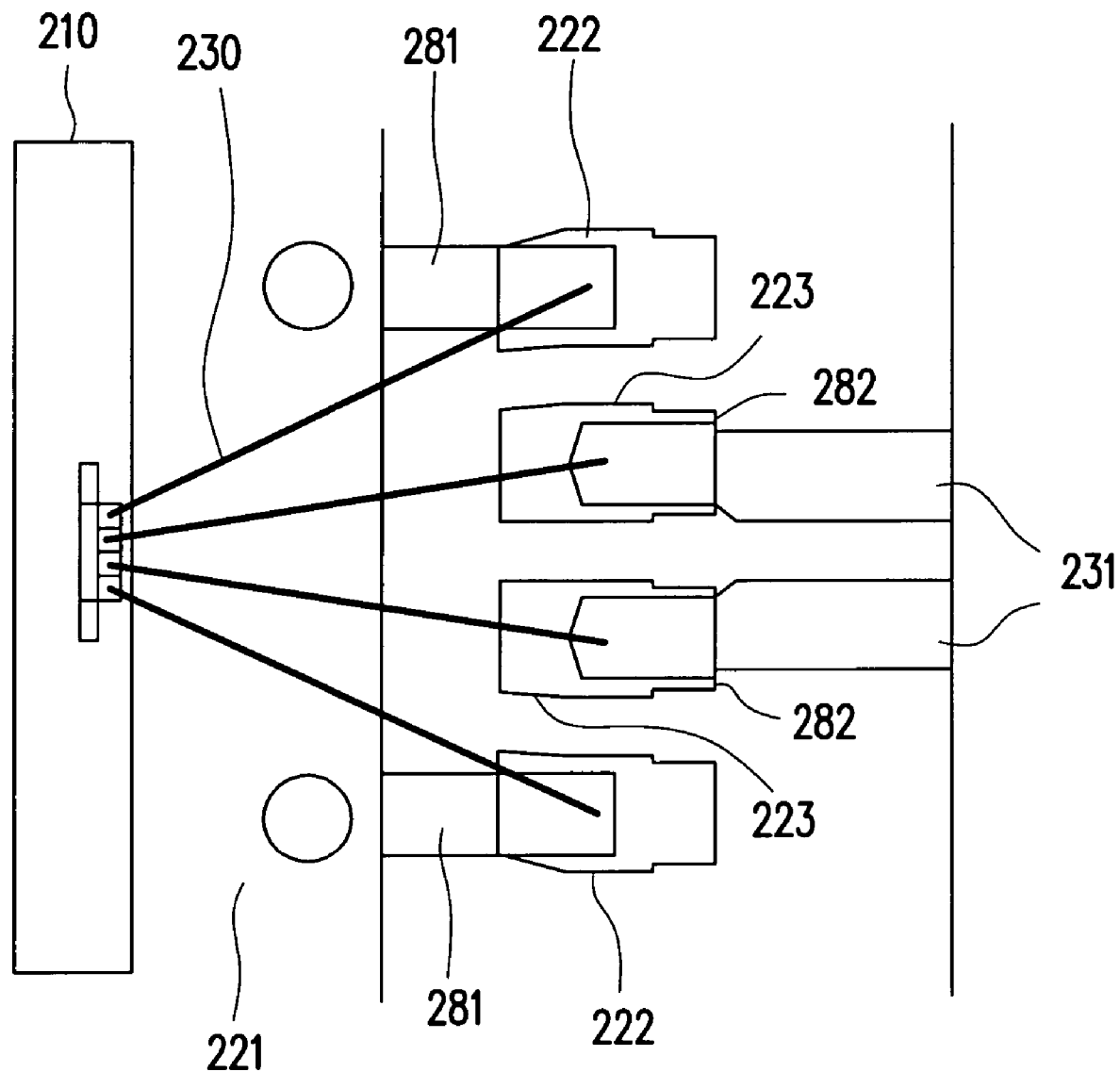
FIG. 2B is a top view of a conventional coplanar bonding wire of differential mode.
Figure 5A:
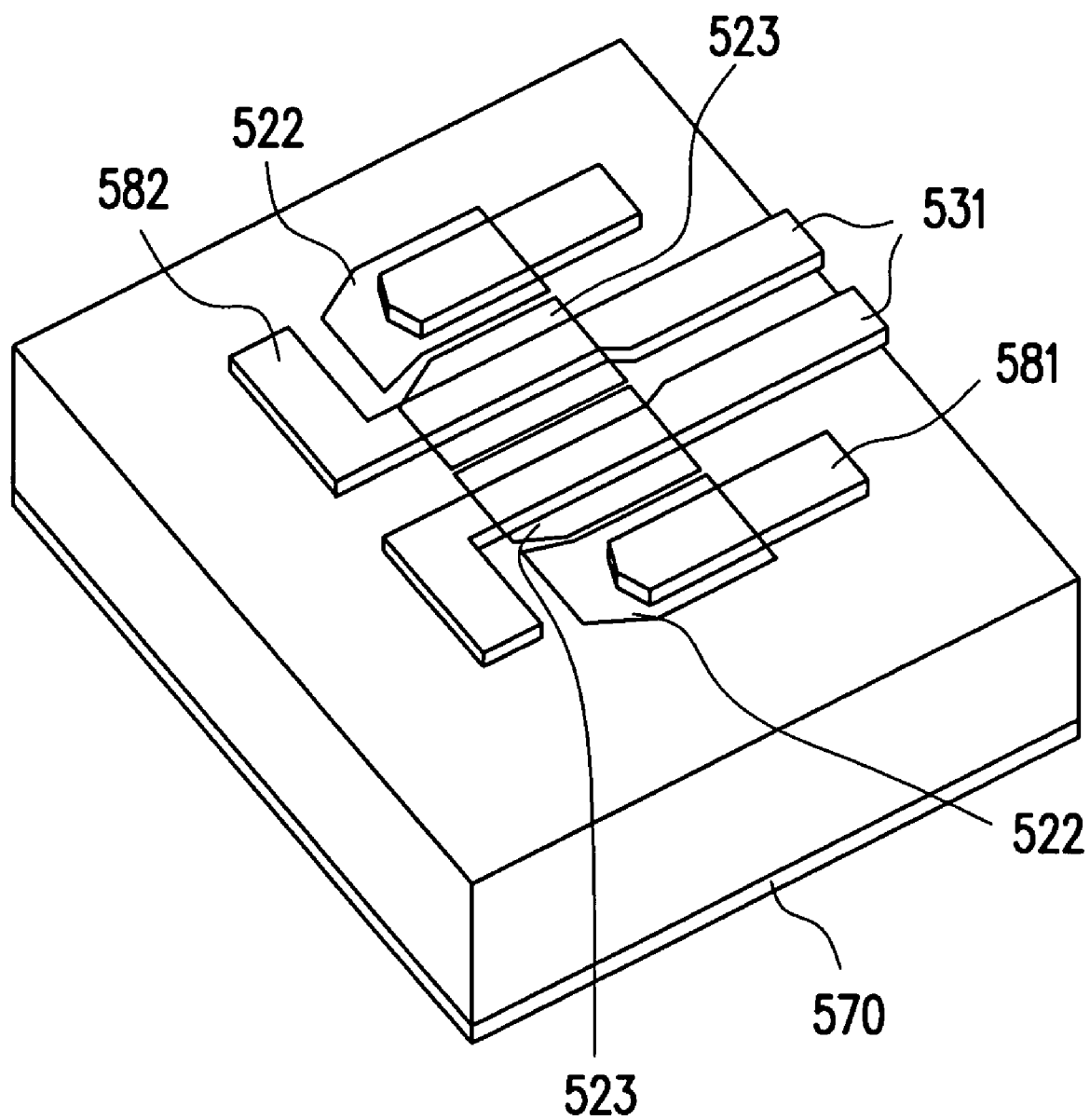
FIG. 5A is a perspective view of protrudent L-shaped mounting pads according to a second preferred embodiment of this invention.
Figure 5B:
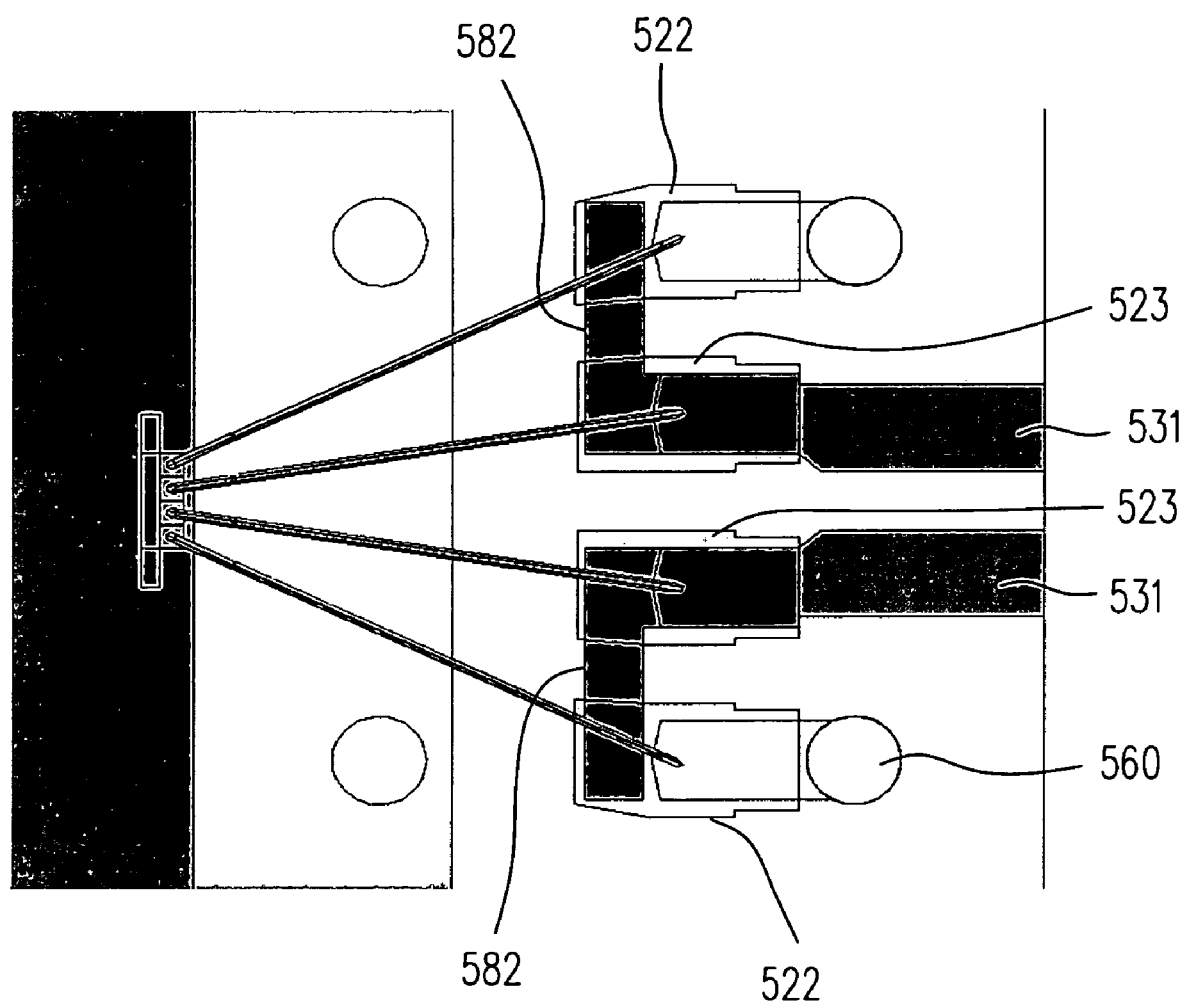
FIG. 5B is a top view of protrudent L-shaped mounting pads according to a second preferred embodiment of this invention.

FIG. 5A is a perspective view of protrudent L-shaped mounting pads according to a second preferred embodiment of this invention. FIG. 5B is a top view of protrudent L-shaped mounting pads according to a second preferred embodiment of this invention. The L-shaped mounting pads are applicable to differential-mode wire-bonding type packages. Referring to FIGS. 5A and 5B, the ground pads 581 are connected to the ground plane 570 through their own vias 560. The two signal leads 523 are adjacent to each other in a differential-mode wire-bonding type packages and contact the respective signal pads 582 which connect to 100-Ohm differential transmission lines for signal passing. To the opposite side which is adjacent to the other signal lead 523, there is an adjacent ground lead 522. Underneath the signal lead 523, there is a signal pad 582 and similarly, there is a ground pad 581 underneath the ground lead 522. Unlike the conventional pad design as seen in FIGS. 2A and 2B, the signal pad 582 is extended towards its adjacent ground pad 581 to overlap with a part of the ground leads 522. However, it shall be noted that the signal pad 582 shall not touch the ground pad 581 and the ground lead 522. Two protrudent L-shaped signal pads 582 are formed in this differential mode circuit. As discovered earlier, when the signal pad 582 size is enlarged, the capacitance between the signal pad 582 and the ground plane 570 in the circuit board can be significantly increased. This increase in capacitance compensates the parasitic inductance induced from the bonding wires 130. Hence, performance of the package at high frequencies can be substantially improved by enlarging the size of the signal pad 582. In addition, by adjusting the size of the signal pad 582, an optimum circuit performance can be achieved.

Third Embodiment

Figure 6A:
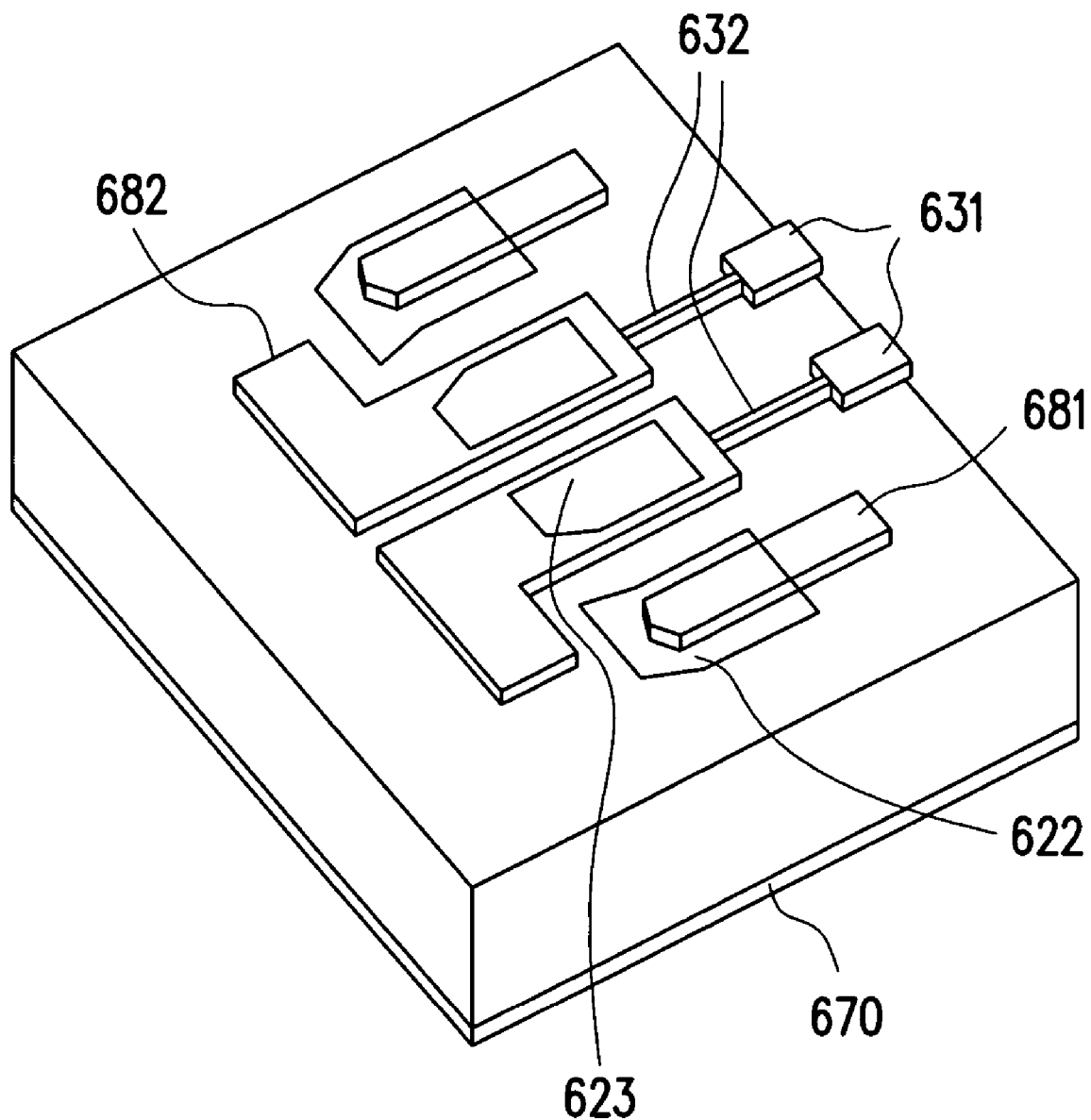
FIG. 6A is a perspective view of protrudent L-shaped mounting pads with multi-stepped transmission lines according to a third preferred embodiment of this invention.
Figure 6B:
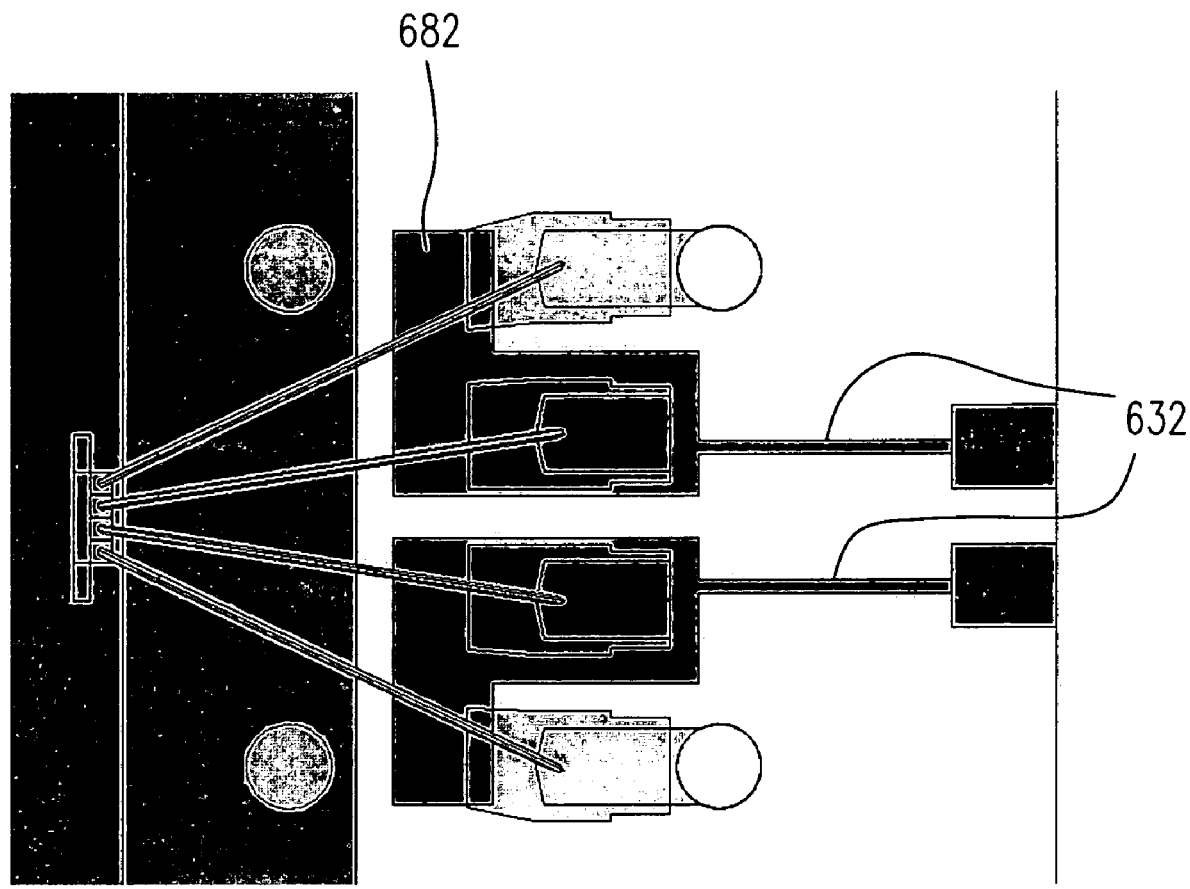
FIG. 6B is a top view of protrudent L-shaped mounting pads with multi-stepped transmission lines according to a third preferred embodiment of this invention.
Figure 7A:
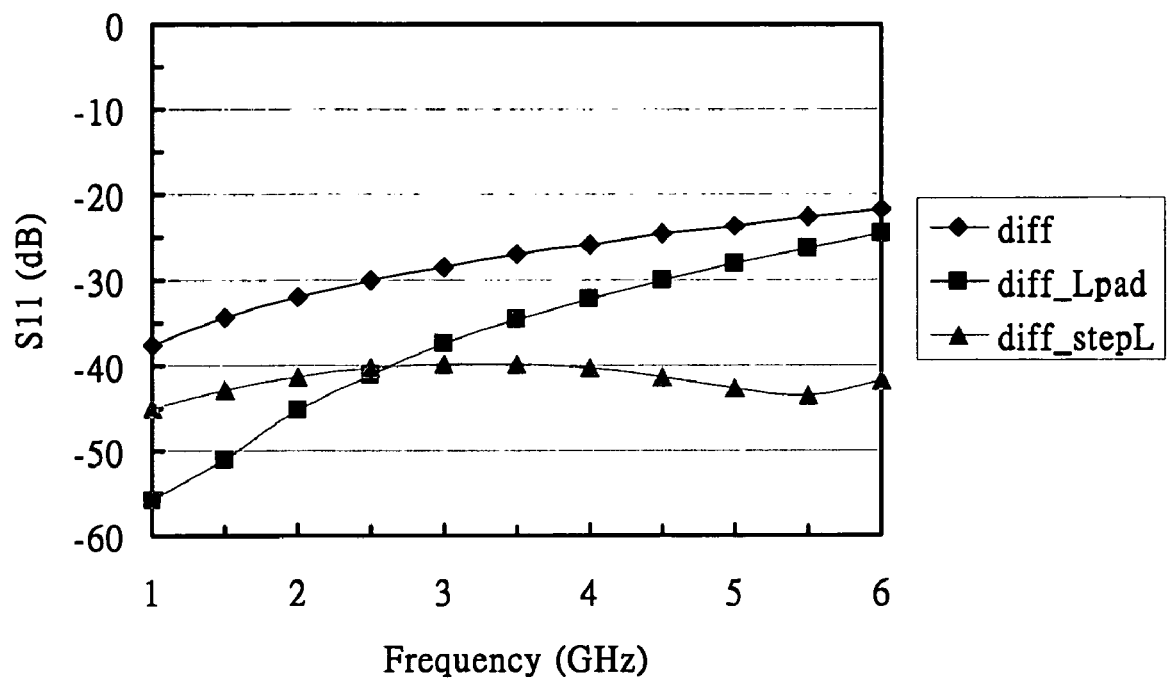
FIG. 7A is a graph showing the $S_{11}$ frequency response curves in various cases of the differential mode.

To improve the frequency response even further, a multi-stepped transmission line 632 is instead of a conventional transmission line to connect the signal pad 682 in FIGS. 6A and 6B. The multi-stepped transmission line 632 can contribute inductance which compensates the over-tuned capacitance from the large protrudent L-shaped pad 682. To observe how the frequency response is affected by this multi-stepped transmission line 632, reference is made to FIGS. 7A and 7B. FIG. 7A is a graph showing the $S_{11}$ frequency response curves in various cases of the differential mode. There are 3 curves, labeled "diff", "diff_Lpad" and "diff_stepL" in FIG. 7A. "diff" represents the conventional pad design of differential mode as seen in FIGS. 2A and 2B. "diff_Lpad" represents the protrudent L-shaped pad design of differential mode as seen in FIGS. 5A and 5B. "diff_stepL" represents the protrudent L-shaped pad design with the multi-stepped transmission line of differential mode as seen in FIGS. 6A and 6B. From the graph, it is observed that the frequency response of "diff_Lpad", the invented L-shaped pad is enhanced comparing with "diff", the conventional pad design. However, as frequency increases, the improvement becomes less significant and hence the multi-stepped transmission line is introduced to further improve the response. The "diff_stepL" curve, which is the protrudent L-shaped pad design with the multi-stepped transmission line, shows an excellent frequency response and it is no longer frequency dependent. There is an optimum point at around 5.5 GHz. The size of the L-shaped pad and the multi-stepped transmission line is adjustable to achieve an optimum frequency response at a particular frequency as desired.

Figure 7B:
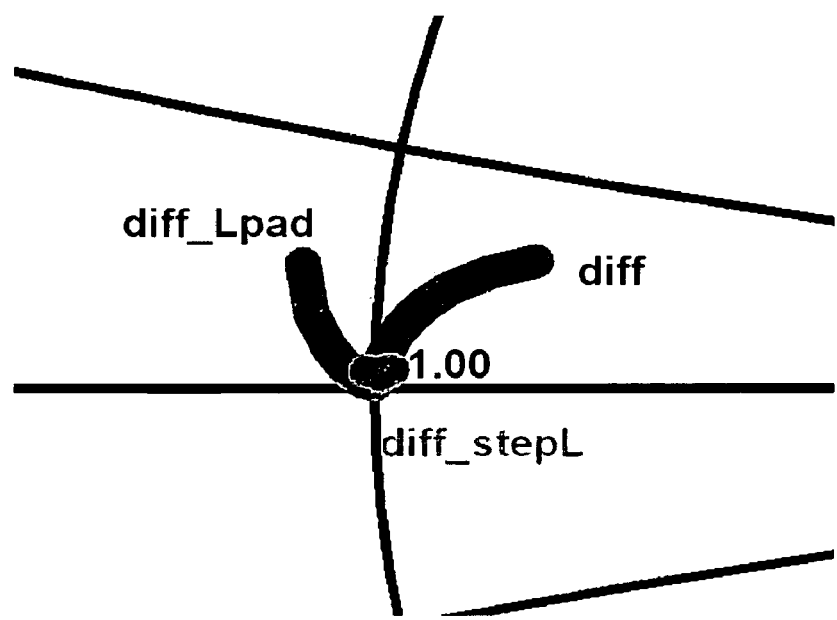
FIG. 7B is a Smith chart showing the frequency response curves in various cases of the differential mode.

FIG. 7B is a Smith chart showing the frequency response curves in various cases of the differential mode. Since the top half of the Smith chart exhibits inductive impedance and the bottom half exhibits capacitive impedance, the best impedance matching is achieved with a $S_{11}$ curve located in the middle of the chart. "diff_Lpad", the protrudent L-shaped pad design has compensated the induced parasitic inductance and so this curve is closer to the center than "diff", the conventional pad design. With the introduction of the multi-stepped transmission line, the "diff_stepL" curve occupies only the center of the chart, and therefore, a superior frequency response is achieved.

The present invention is ideal for RF applications due to its excellent performance at higher frequencies. It is not only easy to implement, just by enlarging the signal pad size, but also there will be no extra cost involved in implementing this invention.

Although ground pad/lead/plane are used as examples in the preferred embodiments, power pad/lead/plane may also be used to replace the ground pad/lead/plane. A term "non-signal" may be used to imply it is either a ground or a power.

In summary, ground pads are directly connected to the ground plane in the circuit board though their own vias. Thus, some spare spaces are vacant for the signal pad to be extended toward its adjacent ground pads which has the effect of providing more capacitance to compensate the inductance induced from the bonding wires. The impedance is better matched and the frequency response between 1 GHz to 6 GHz is significantly improved. Moreover, the impedance matching can be further improved by inserting a multi-stepped transmission line between the signal pad and a 100-Ohm differential transmission line. In conclusion, the invented pad design exhibits excellent frequency response and makes it suitable for RF applications.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A lead-frame package, comprising:
    a die pad;
    a chip attached to the die pad;
    a plurality of signal leads and a plurality of non-signal leads;
    a plurality of bonding wires connecting the chip to the leads respectively;
    a substrate with a plurality of pads disposed on a top surface of the substrate, the pads comprising:
        a plurality of signal pads which are underneath the signal leads respectively and a plurality of non-signal pads which are underneath the non-signal leads respectively, wherein at least one of the signal pads has a structure which extends toward at least one of the adjacent non-signal pads and overlaps with at least a part of the adjacent non-signal lead but without touching the adjacent non-signal pad and the adjacent non-signal lead, and the adjacent non-signal pad connects to a non-signal plane in the substrate through a via; and
    an insulation material encapsulating the leads, the chip, and the bonding wires.

2. The lead-frame package of claim 1, wherein the signal pad is a T-shaped structure for a single-ended mode wire-bonding type package.

3. The lead-frame package of claim 1, wherein the signal pad is an L-shaped structure for a differential mode wire-bonding type package.

4. The lead-frame package of claim 1, wherein the signal pad is extended over the adjacent non-signal lead.

5. The lead-frame package of claim 1, wherein the non-signal pad is a ground pad or a power pad, and the non-signal lead is a ground lead or a power lead.

6. The lead-frame package of claim 1, wherein the non-signal plane is a ground plane or a power plane.

7. The lead-frame package of claim 1, wherein a multi-stepped transmission line electrical connects the signal pad for signal passing.

8. A single-ended mode wire-bonding type lead-frame package having a die pad, a chip attached to the die pad, a plurality of signal leads, a plurality of non-signal leads, a plurality of bonding wires connecting the chip to the leads respectively, and an insulation material encapsulating the leads, the chip, and the bonding wires, comprising:
    a substrate with a plurality of pads disposed on a top surface of the substrate, the pads comprising:
        a plurality of signal pads which are underneath the signal leads respectively and a plurality of non-signal pads which are underneath the non-signal leads respectively, wherein at least one of the signal pads has a structure which extends toward at least one of the adjacent non-signal pads and overlaps with at least a part of the adjacent non-signal lead but without touching the adjacent non-signal pad and the adjacent non-signal lead, and the adjacent non-signal pad connects to a non-signal plane in the substrate through a via.

9. The lead-frame package of claim 8, wherein the signal pad is a T-shaped structure.

10. The lead-frame package of claim 8, wherein the signal pad is an L-shaped structure.

11. The lead-frame package of claim 8, wherein the signal pad is extended over the adjacent non-signal lead.

12. The lead-frame package of claim 8, wherein the non-signal pad is a ground pad or a power pad, and the non-signal lead is a ground lead or a power lead.

13. The lead-frame package of claim 8, wherein the non-signal plane is a ground plane or a power plane.

14. The lead-frame package of claim 8, wherein a multi-stepped transmission line electrical connects the signal pad for signal passing.

15. A differential mode wire-bonding type lead-frame package having a die pad, a chip attached to the die pad, a plurality of signal leads, a plurality of non-signal leads, a plurality of bonding wires connecting the chip to the leads respectively, and an insulation material encapsulating the leads, the chip, and the bonding wires, comprising:
 a substrate with a plurality of pads disposed on a top surface of the substrate, the pads comprising:
  two signal pads which adjacent to each other are underneath the signal leads, and two non-signal pads which are disposed on the outer sides of the two signal pads respectively and are underneath the non-signal leads, wherein each of the two signal pads extends toward the adjacent non-signal pad respectively and overlaps with at least a part of the adjacent non-signal lead, but without touching the adjacent non-signal pad and the adjacent non-signal lead, and the two non-signal pads connect to a non-signal plane in the substrate through vias respectively.

16. The lead-frame package of claim 15, wherein the two signal pads are two distinct L-shaped signal pads.

17. The lead-frame package of claim 15, wherein the signal pad is extended over the adjacent non-signal lead.

18. The lead-frame package of claim 15, wherein the non-signal pad is a ground pad or a power pad and the non-signal lead is a ground lead or a power lead.

19. The lead-frame package of claim 15, the non-signal plane is a ground plane or a power plane.

20. The lead-frame package of claim 15, wherein a multi-stepped transmission line electrical connects the signal pad for signal passing.

* * * * *